US010566158B2

(12) United States Patent
Ledbetter

(10) Patent No.: US 10,566,158 B2
(45) Date of Patent: Feb. 18, 2020

(54) METHOD FOR RECONDITIONING OF VACUUM INTERRUPTERS

(71) Applicant: Finley Lee Ledbetter, Argyle, TX (US)

(72) Inventor: Finley Lee Ledbetter, Argyle, TX (US)

(*) Notice: Subject to any disclaimer, the term of this patent is extended or adjusted under 35 U.S.C. 154(b) by 0 days.

(21) Appl. No.: 16/218,166

(22) Filed: Dec. 12, 2018

(65) Prior Publication Data

US 2019/0180962 A1     Jun. 13, 2019

Related U.S. Application Data

(60) Provisional application No. 62/598,155, filed on Dec. 13, 2017, provisional application No. 62/684,350, filed on Jun. 13, 2018, provisional application No. 62/711,020, filed on Jul. 27, 2018.

(51) Int. Cl.
| | | |
|---|---|---|
| *H01H 9/30* | (2006.01) | |
| *H01H 33/662* | (2006.01) | |
| *H01T 4/00* | (2006.01) | |
| *H01G 9/18* | (2006.01) | |
| *H03K 17/00* | (2006.01) | |

(52) U.S. Cl.
CPC ........ *H01H 33/66238* (2013.01); *H01G 9/18* (2013.01); *H01H 9/30* (2013.01); *H01T 4/00* (2013.01); *H03K 17/00* (2013.01)

(58) Field of Classification Search
CPC .. H01H 9/30; H01H 33/66238; H01H 33/668; H01H 33/6683; H01H 33/6606; H01H 33/66207; H01G 9/18; H01B 17/36
USPC ................ 218/134, 122, 131, 155; 174/14 R
See application file for complete search history.

(56) References Cited

U.S. PATENT DOCUMENTS

| | | | | |
|---|---|---|---|---|
| 3,090,852 | A * | 5/1963 | Greenwood | ....... H01H 33/6683 218/131 |
| 4,163,130 | A | 7/1979 | Kubota et al. | |
| 4,440,995 | A * | 4/1984 | Lange | .................. H01H 33/668 218/122 |
| 4,672,323 | A * | 6/1987 | Kuhl | .................... H01H 33/668 218/122 |

(Continued)

OTHER PUBLICATIONS

International Search Report and Written Opinion for International Application No. PCT/US2018/065483 dated May 3, 2019, 11 pages.

*Primary Examiner* — Edwin A. Leon
*Assistant Examiner* — William A Bolton
(74) *Attorney, Agent, or Firm* — Foley & Lardner LLP

(57) ABSTRACT

Disclosed is a method of reconditioning a vacuum interrupter that comprises determining whether the vacuum interrupter is suitable for reconditioning. Where the vacuum interrupter is suitable for reconditioning, the method comprises reducing pressure inside vacuum interrupter using magnetron pumping, and/or forming at least one hole in an endcap of a vacuum envelope of the vacuum interrupter, cleaning components of the vacuum interrupter inside the vacuum envelope by introducing at least one cleaning solution into the interior of the vacuum envelope through the at least one hole in the endcap, removing the cleaning solution from the interior of the vacuum envelope, installing a plug in the at least one hole, wherein the plug has getter material on a surface thereof facing the interior of the vacuum envelope, and vacuum sealing the plug to the at least one hole such that a vacuum is re-established in the interior of the vacuum envelope.

56 Claims, 8 Drawing Sheets

(56) References Cited

U.S. PATENT DOCUMENTS

| | | | |
|---|---|---|---|
| 4,880,947 A | 11/1989 | Fey et al. | |
| 5,739,419 A * | 4/1998 | Maier | H01H 33/668 324/409 |
| 6,335,502 B1 | 1/2002 | Kikukawa et al. | |
| 6,495,786 B1 * | 12/2002 | Tsuji | H01H 33/668 218/118 |
| 8,471,166 B1 | 6/2013 | Glaser | |
| 2005/0282473 A1 | 12/2005 | Saito et al. | |
| 2015/0226804 A1 | 8/2015 | Ledbetter | |

* cited by examiner

METHOD FOR RECONDITIONING OF VACUUM INTERRUPTERS

PRIOR RELATED APPLICATIONS

This application claims benefit of U.S. Provisional Patent Application Ser. No. 62/711,020 entitled "Method for Reconditioning of Vacuum Interrupters," filed on Jul. 27, 2018, U.S. Provisional Patent Application Ser. No. 62/684,350 entitled "Method for Reconditioning Vacuum Interrupters," filed on Jun. 13, 2018, and U.S. Provisional Patent Application Ser. No. 62/598,155 entitled "Method for Reconditioning Vacuum Interrupters," filed on Dec. 13, 2017.

FEDERALLY SPONSORED RESEARCH STATEMENT

Not Applicable (N/A)

REFERENCE TO MICROFICHE APPENDIX

N/A

FIELD OF INVENTION

This application is directed to the field of vacuum interrupters, and, more particularly, to the extension of the service life of vacuum interrupters by reconditioning eligible vacuum interrupters.

BACKGROUND

In electrical engineering, a vacuum interrupter is a mechanical switch which makes and breaks electrical contact in a vacuum. The purpose of making, and in particular breaking, the electrical contact in vacuum is to quickly extinguish the resulting vacuum arc which occurs when a high voltage electrical contact is broken or separated from one another. Vacuum interrupters are used, for example, in utility power transmission systems and in power-distribution systems and industrial plants. For example, vacuum interrupters can be used for circuit-breakers and load switches. Circuit-breaker vacuum interrupters are primarily used in the power sector in substation and power-grid facilities, and load-switching vacuum interrupters are primarily used for power-grid end users. Like other equipment, vacuum interrupters degrade over time.

At the present time, when a vacuum interrupter degrades sufficiently, it requires replacement, which may be costly. In addition, due to the large number of vacuum interrupter models and ratings, acquiring a direct replacement may be difficult, or may take an undesirably long amount of time. Therefore, the present practice of replacing vacuum interrupters is undesirable, and there is a long felt need in the technical field for a way to recondition vacuum interrupters so as to extend their service life.

SUMMARY OF THE INVENTION

Disclosed herein is a method of reconditioning a vacuum interrupter. The method comprises determining whether the vacuum interrupter is suitable for reconditioning. Where the vacuum interrupter is suitable for reconditioning, in an embodiment, the method proceeds with applying a magnetic field to the vacuum interrupter with a moving contact of the vacuum interrupter moved away from a fixed contact of the vacuum interrupter to break electrical contact, and applying a voltage to the vacuum interrupter to reduce the pressure inside the vacuum interrupter.

The applying the voltage to the vacuum interrupter may be performed by electrically coupling a current meter to a first conductor of the vacuum interrupter, and electrically coupling a high voltage power supply to a second conductor of the vacuum interrupter to reduce pressure inside the vacuum interrupter.

The magnetic field and/or the voltage may be applied for a long term (typically 5-10 minutes in duration or longer) or a short term (less than 5 minutes) period of time. The magnetic field and/or voltage may be applied for about 30 minutes. The magnetic field and/or voltage may be applied for about 3 minutes.

The magnetic field and/or the voltage may be applied repetitively for a long term (typically 10-20 pulses in duration or longer) or a short term (less than 5 pulses). The magnetic field and/or voltage may be applied repetitively for about 10 pulses.

The magnetic field may be from about 0.04 Tesla to about 0.2 Tesla, and any range or value there between.

The applied voltage may be from about 5 kVDC to about 100 kVDC, and any range or value there between. The applied voltage may be from about 50 kVDC to about 100 kVDC, and any range or value there between. The applied voltage may be from about 5 kVDC to about 25 kVDC, and any range or value there between.

Where the vacuum interrupter is suitable for reconditioning, in an embodiment, the method may proceed with forming at least one hole in an endcap of a vacuum envelope of the vacuum interrupter, cleaning components of the vacuum interrupter inside the vacuum envelope, installing a plug in the at least one hole, wherein the plug has getter material on a surface thereof facing the interior of the vacuum envelope, and vacuum sealing the plug to the at least one hole such that a vacuum is re-established in the interior of the vacuum envelope. The cleaning of components of the vacuum interrupter inside the vacuum envelope may be performed by introducing at least one cleaning solution into the interior of the vacuum envelope through the at least one hole in the endcap, and removing the cleaning solution from the interior of the vacuum envelope.

The cleaning of components of the vacuum interrupter inside the vacuum envelope may be performed by baking the vacuum interrupter.

The cleaning of components of the vacuum interrupter inside the vacuum envelope may performed by pumping dry gas, such as nitrogen and/or argon, inside the vacuum envelope via the at least one hole.

Where the vacuum interrupter is suitable for reconditioning, the exterior surface of the vacuum envelope may be polished.

In some cases, determining whether the vacuum interrupter is suitable for reconditioning may comprise determining whether components within the vacuum envelope of the vacuum interrupter are damaged, determining whether the vacuum envelope has a leak, and estimating a remaining life of a fixed contact and a moving contact within the vacuum envelope.

Determining whether components within the vacuum envelope of the vacuum interrupter are damaged may comprise measuring a contact resistance between the fixed contact and the moving contact.

Estimating the remaining life of the fixed contact and the moving contact may comprise performing a contact erosion test.

In some cases, forming the at least one hole in the endcap may comprise opening, and possibly removing, a tube having a sealed end and passing through the endcap so as to expose a first hole through which the tube passed, and forming a second hole in the endcap.

In other cases, forming the at least one hole in the endcap may comprise forming a first hole in the endcap, and forming a second hole in the endcap.

When the vacuum interrupter is suitable for reconditioning, the vacuum interrupter may be tested to verify the presence of the vacuum and an absence of leaks, after the vacuum sealing of the plug to the at least one hole.

When the vacuum interrupter is suitable for reconditioning, external coatings may be removed from the vacuum interrupter prior to forming the at least one hole in the endcap.

In some cases, cleaning components of the vacuum interrupter inside the vacuum envelope may comprise pumping a mechanical cleaning solution into the first hole in the endcap, and receiving outflow of the mechanical cleaning solution from the second hole in the endcap. Additionally or alternatively, cleaning components of the vacuum interrupter inside the vacuum envelope may comprise pumping a chemical cleaning solution into the first hole in the endcap, and receiving outflow of the chemical cleaning solution from the second hole in the endcap. Cleaning components of the vacuum interrupter inside the vacuum envelope may also comprise measuring a number of solid particles in the outflow of the chemical cleaning solution to determine when at least a first step of the cleaning is complete.

In addition to the above cleaning steps, the vacuum interrupter may be laid on its side, and an amount of a first electropolishing solution and/or etching solution may be pumped into the first hole in the end cap sufficient to permit electropolishing and/or etching of an interior surface of the vacuum envelope but insufficient to fill the vacuum envelope to a level where a fixed contact and a moving contact within the vacuum envelope touch the first electropolishing and/or etching solution. The interior surface of the vacuum envelope may be electropolished and/or etched, outflow of the first electropolishing and/or etching solution may be received from the second hole in the endcap, and the vacuum interrupter may be stood up on an end thereof. An amount of a second electropolishing and/or etching solution may be pumped into the first hole in the end cap sufficient to fill the vacuum envelope to a level where the fixed contact and the moving contact are immersed in the electropolishing and/or etching solution, and the fixed contact and the moving contact may be electropolished and/or etched. The first electropolishing and/or etching solution is a solution that may damage the fixed contact and the moving contact but the second electropolishing and/or etching solution does not damage the interior surface of the vacuum envelope.

In some cases, the method proceeds with again applying a magnetic field to the vacuum interrupter with a moving contact of the vacuum interrupter moved away from a fixed contact of the vacuum interrupter to break electrical contact, and again applying a voltage to the vacuum interrupter to reduce the pressure inside the vacuum interrupter.

The applying the voltage to the vacuum interrupter may be performed by electrically coupling a current meter to a first conductor of the vacuum interrupter, and electrically coupling a high voltage power supply to a second conductor of the vacuum interrupter to reduce pressure inside the vacuum interrupter.

The magnetic field and/or the voltage may be applied for a long term (typically 5-10 minutes in duration or longer) or a short term (less than 5 minutes) period of time. The magnetic field and/or voltage may be applied for about 30 minutes. The magnetic field and/or voltage may be applied for about 3 minutes.

The magnetic field and/or the voltage may be applied repetitively for a long term (typically 10-20 pulses in duration or longer) or a short term (less than 5 pulses). The magnetic field and/or voltage may be applied repetitively for about 10 pulses.

The magnetic field may be from about 0.04 Tesla to about 0.2 Tesla, and any range or value there between.

The applied voltage may be from about 5 kVDC to about 100 kVDC, and any range or value there between. The applied voltage may be from about 50 kVDC to about 100 kVDC, and any range or value there between. The applied voltage may be from about 5 kVDC to about 25 kVDC, and any range or value there between.

These and other objects, features and advantages will become apparent as reference is made to the following detailed description, preferred embodiments, and examples, given for the purpose of disclosure, and taken in conjunction with the accompanying drawings and appended claims.

BRIEF DESCRIPTION OF THE DRAWINGS

For a further understanding of the nature and objects of the present invention, reference should be made to the following detailed disclosure, taken in conjunction with the accompanying drawings, in which like parts are given like reference numerals, and wherein.

DETAILED DESCRIPTION OF EMBODIMENTS OF THE INVENTION

The following detailed description of various embodiments of the present invention references the accompanying drawings, which illustrate specific embodiments in which the invention can be practiced. While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which the invention pertains. Therefore, the scope of the present invention is defined only by the appended claims, along with the full scope of equivalents to which such claims are entitled.

Figure 1:
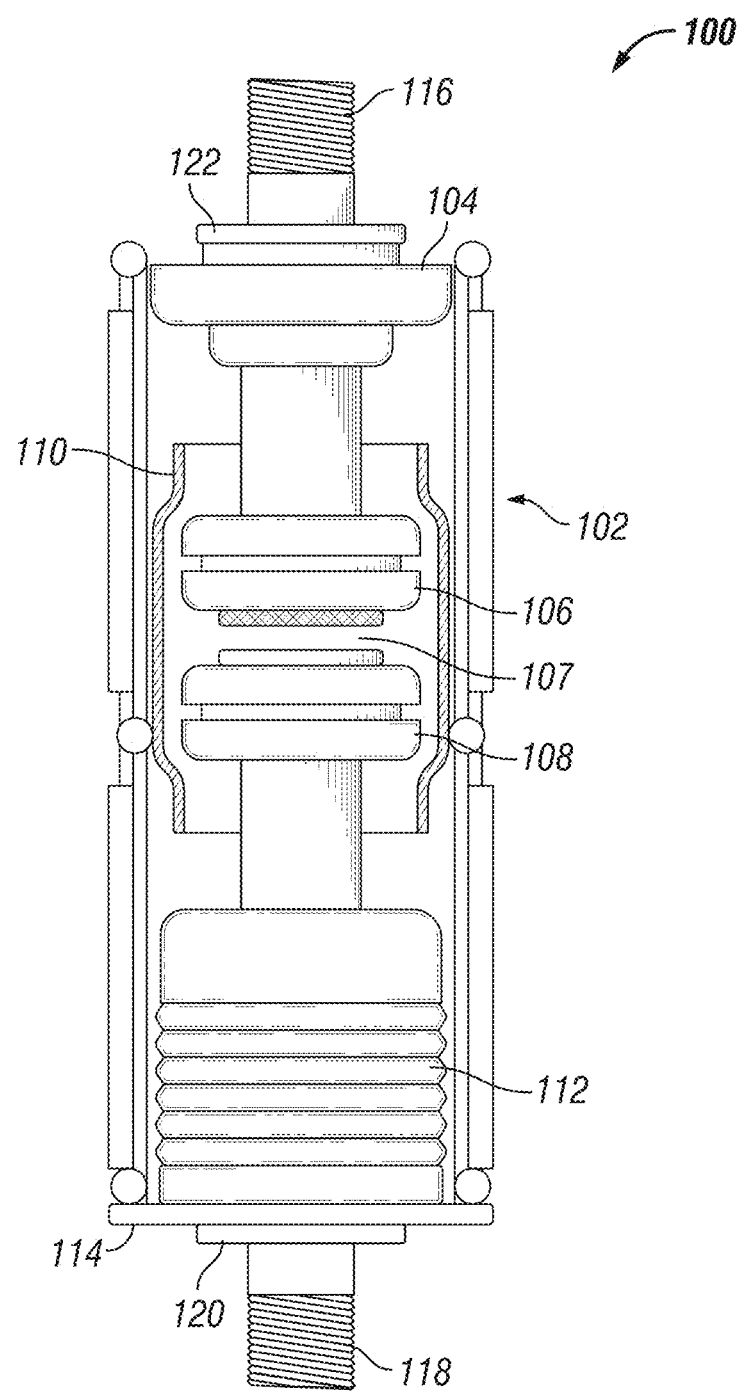
FIG. 1 is a schematic cross sectional view of a typical vacuum interrupter.

Structure of a typical vacuum interrupter 100 is now described with reference to FIG. 1. The vacuum interrupter 100 comprises a vacuum envelope 102 constructed from a material, such as glass or ceramic, that is both substantially impermeable to gas as well as non-outgassing. End caps 104 and 114 hermetically seal the ends of the vacuum envelope 102. A feedthrough 122 in the end cap 104 permits the passage of a first conductor 116 there through, while maintaining hermetic sealing. Likewise, a bushing 120 is in the end cap 114 and provides a bearing surface between the second conductor 118 and the end cap 114. A fixed contact 106 is within the vacuum envelope 102 and is electrically coupled to the first conductor 116. A movable contact 108 is within the vacuum envelope 102 and is electrically coupled to the second conductor 118. Bellows 112 permit the movement of the moving contact 108 toward the fixed contact 106 to make electrical contact therewith and permits the passage of a second conductor 118 there through, while maintaining hermetic sealing.

When electrical contact is present between the fixed contact 106 and moving contact 108, and is then broken, a vacuum arc occurs, but quickly dissipates. Material from the fixed contact 106 and moving contact 108 may be vaporized during a vacuum arc. So as to prevent this material from condensing on the interior surface of the vacuum envelope, which could eventually lead to failure, a vapor shield 110 surrounds the fixed contact 106 and moving contact 108. Similarly, vapor shields (not shown) shield the end caps 104 and 114 from condensation of this material.

As can be appreciated, over time, the vacuum interrupter 100 degrades. Leaks in the vacuum envelope 102 may occur, outgassing of components may degrade the vacuum in the vacuum envelope 102, and the contacts 104 and 114 may erode due to material thereof being vaporized, degrading the electrical performance thereof.

As explained, conventionally, when a vacuum interrupter 100 degrades sufficiently, it is replaced. This is costly and undesirable. Therefore, the Inventors have developed a method for reconditioning certain vacuum interrupters 100.

Figure 2A:
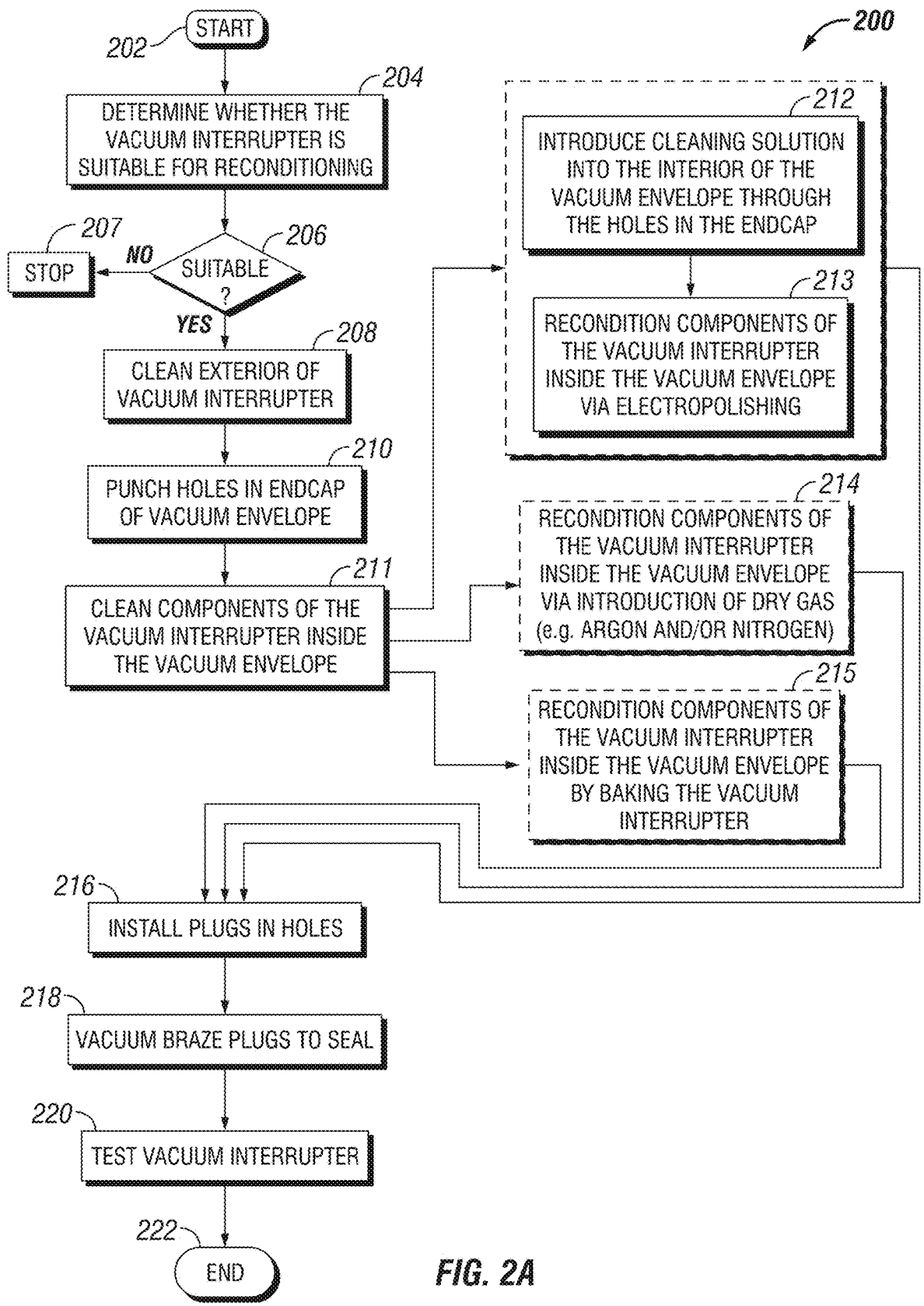
FIG. 2A is a flowchart of a method of reconditioning a vacuum interrupter, according to an embodiment of the present invention.
Figure 2B:
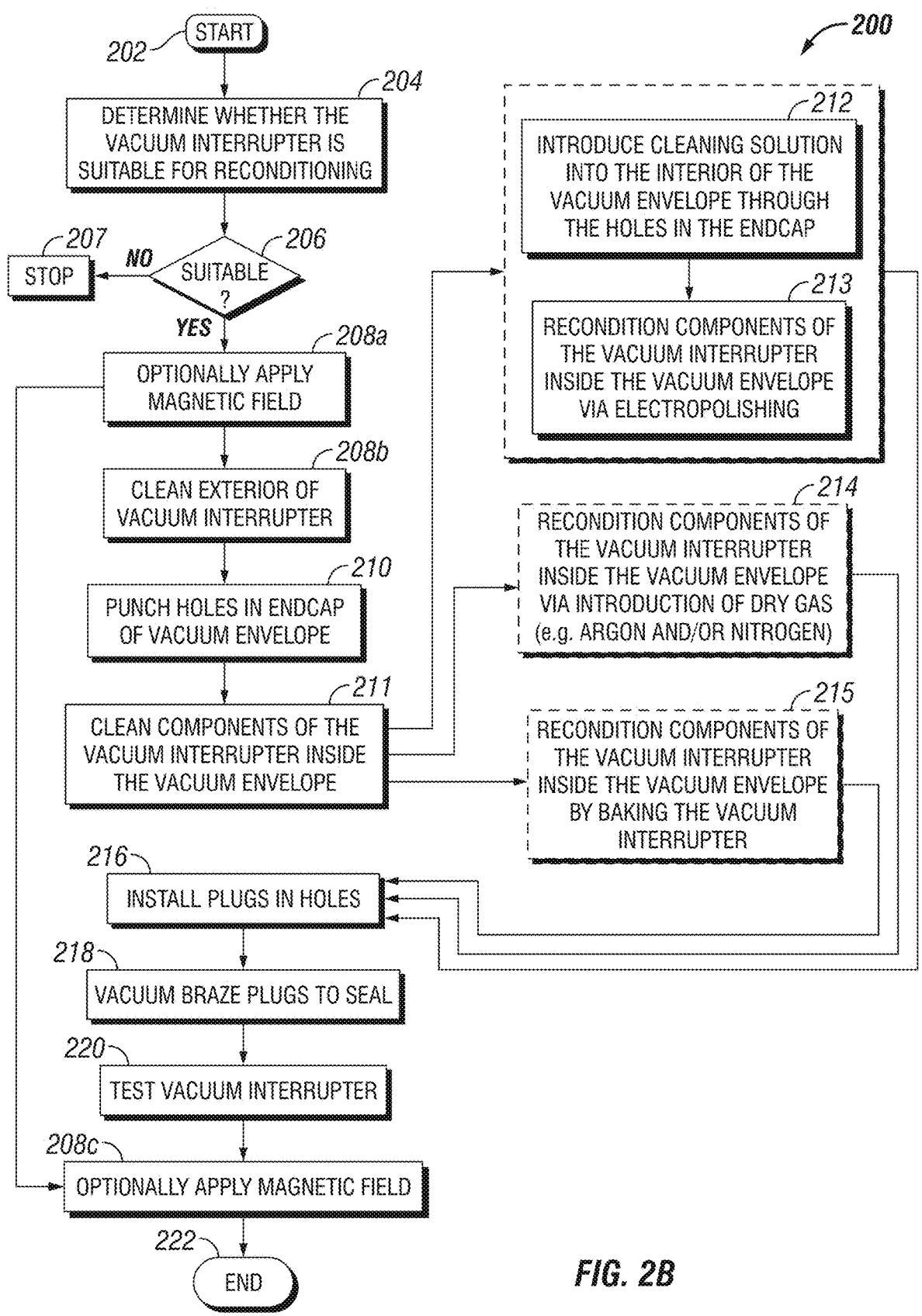
FIG. 2B is a flowchart of an alternative method of reconditioning a vacuum interrupter, according to an embodiment of the present invention, showing optionally reducing pressure inside vacuum interrupter using magnetron pumping.

This method and alternative methods will now be described with reference to a flowchart 200 of FIGS. 2A and 2B.

Method of Reconditioning a Vacuum Interrupter

After the start (Block 202), the method begins with determining whether the vacuum interrupter in question is actually suitable for reconditioning (Block 204). Here, the vacuum interrupter may be removed from service and its installation, and it is determined whether the vacuum interrupter is in a good enough condition to permit for reconditioning, and whether, if the vacuum interrupter is in good enough condition, reconditioning is even desirable for that make and model of vacuum interrupter. If a vacuum interrupter has not out lived its wear limits or its contact structure has not seen too much damage, the vacuum interrupter will likely be suitable for reconditioning. Most vacuum interrupters have seen little operation or use. They need only to be reconditioned to go back into service. Expensive vacuum interrupters, or vacuum interrupter models for which immediate replacements are not available are particularly desirable candidates.

Regarding the condition of the vacuum interrupter itself, the vacuum interrupter will desirably be free of damage, will not have a leak, have contacts with at least 50% of their life remaining, and have that have a low resistance (and thus high conductance). Tests are performed in order to make these determinations.

For example, a visual inspection is used to check for corrosion and/or external damage. An external leak test or a magnetron test is performed to verify the absence of leaks. A contact erosion inspection/test is performed to verify that the contacts have at least 50% of their life remaining. This contact erosion inspection/test may be performed using x-ray imaging techniques. A contact resistance test performed with a digital low resistance ohmmeter is used to determine the resistance of the contact, and is passed if the resistance is below a given value.

If the vacuum interrupter is unsuitable for reconditioning (at Block 206), either because of its condition, or because it is a model where reconditioning is not economically advantageous, then the method ends (Block 207). If the vacuum interrupter is found to be suitable for reconditioning (at Block 206), then the exterior of the vacuum interrupter is cleaned (Block 208). This cleaning can be performed by removing paint and external coatings on the vacuum interrupter, through the use of chemicals to clean the exterior surface of the vacuum interrupter, and then the washing of the vacuum interrupter.

After cleaning, if a pinched tube exists that travels through an endcap of the vacuum interrupter, such as may have been used during manufacture to generate the vacuum within the vacuum interrupter, the pinched tube and an associated stem guide can be removed, and the hole remaining can be used as a hole during the reconditioning process. Another hole may, in some embodiments, then be formed in either the endcap through which the pinched tube passed, or in the opposite endcap. If a pinched tube is not present, then two holes may be formed in either the same endcap, or with one each at opposing endcaps. The result of either alternative is that the vacuum interrupter now has a sum total of two holes in its endcaps (Block 210). It should be understood that in some embodiments only one hole in the endcaps may be necessary to accomplish the reconditioning process.

Therefore, in the present embodiment, the vacuum interrupter is now externally cleaned and has two holes in it, ready for reconditioning to begin (Block 211). The reconditioning process may begin with the pumping of a cleaning solution into the interior of the vacuum envelope of the vacuum interrupter through one hole, and the receipt of cleaning solution outflow from the other hole (Block 212). The cleaning solution used may be a chemical cleaning solution, such as methanol or acetone, may be an abrasive solution, or may be a combination of both.

Figure 3:
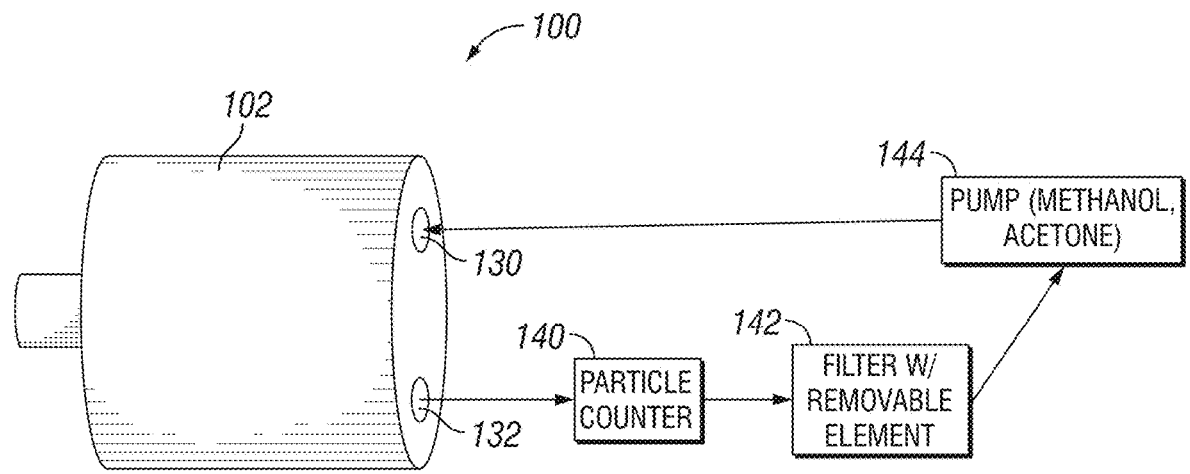
FIG. 3 is a block diagram showing cleaning of internals of a vacuum interrupter, according to an embodiment of the present invention.

The setup for this step is shown in FIG. 3. Here, it can be seen that a pump 144 is configured to pump the cleaning solution into the hole 130. Outflow is received from the hole 132. A particle counter 140 counts the solid particles in the outflow, and this count can be used to determine whether the cleaning process is complete. The outflow is run through a filter 142, which may have a removable and replaceable filtering element. This filter removes the solid particles from the output. The now cleaned outflow from the filter 142 is fed back to the pump 144, to be fed back into the hole 130. In some embodiments, only one hole is made in the endcaps and the cleaning solution is pumped into the hole and then removed from the same hole, after the cleaning solution step 212 has performed.

As depicted, the vacuum interrupter 100 is laid on its side during this process, although in some cases it may instead be stood on its end for this process.

After this cleaning step, an optional electropolishing is performed (Block 213) so as to recondition the interior surface of the vacuum envelope and the contact. This electropolishing is performed in two steps.

Figure 4:
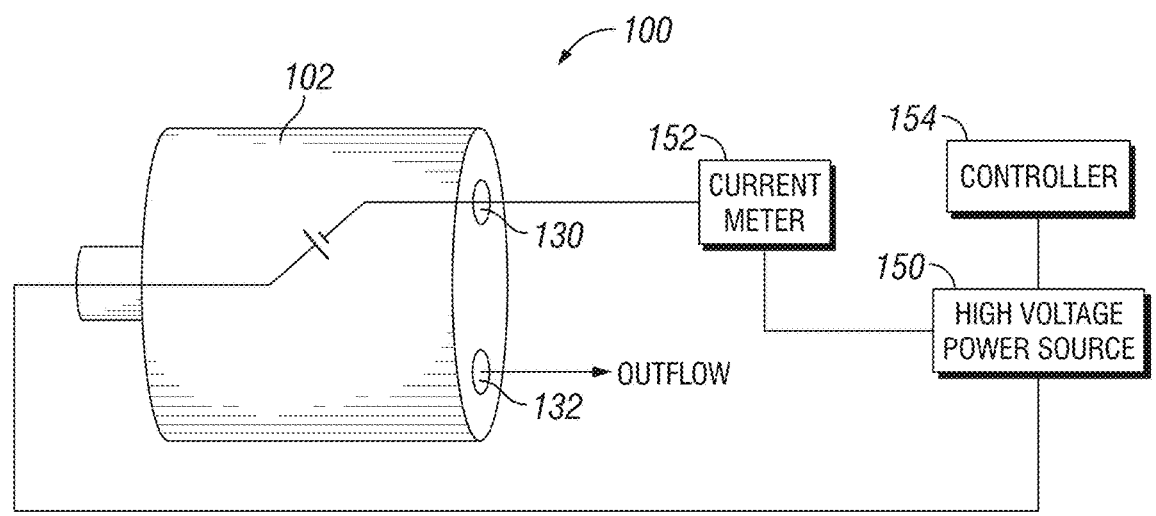
FIG. 4 is a block diagram showing reconditioning of an interior surface of the vacuum envelope of a vacuum interrupter, according to an embodiment of the present invention.

First, the vacuum interrupter 100 is set on its side, as shown in FIG. 4. Then, an amount of a first electropolishing solution is pumped into the hole 130. This amount is sufficient to permit electropolishing of the interior surface of the vacuum envelope 102 but insufficient to fill the vacuum envelope 102 to a level where the contacts within the vacuum envelope touch the first electropolishing solution. This is done because the first electropolishing solution is harsh (or acidic) enough to damage the contacts, yet this level of harshness (or acidity) is used to accomplish the electropolishing of the interior surface of the vacuum envelope 102. Then, the electropolishing of the interior surface of the vacuum envelope 102 is performed while rotating the vacuum interrupter 100 so as to clean the entire interior surface of the vacuum envelope 102.

In electropolishing, as understood by those of skill in the art, the vacuum envelope 102 acts as an anode, and a cathode is inserted into the hole 130. The immersion in the electropolishing solution (which contains electrolytes), and the application of a voltage from a power supply 150 results in the electrical connection shown in FIG. 5. A current passes from the anode (the vacuum envelope 102) to the cathode, oxidizing and dissolving metal that may be on the interior surface of the vacuum envelope 102, helping to smooth the surface of the vacuum envelope 102. A current meter 152 measures this produced current so that the high voltage power source 150 (e.g., from about 50 kVDC to about 100 kVDC), under direction of the controller 154, maintains the produced current at a desired level (e.g., from about 5 µA to about 20 µA).

Once electropolishing of the interior surface of the vacuum envelope 102 is completed, outflow is received through the hole 132, or in some embodiments through the first hole 130.

Figure 5:
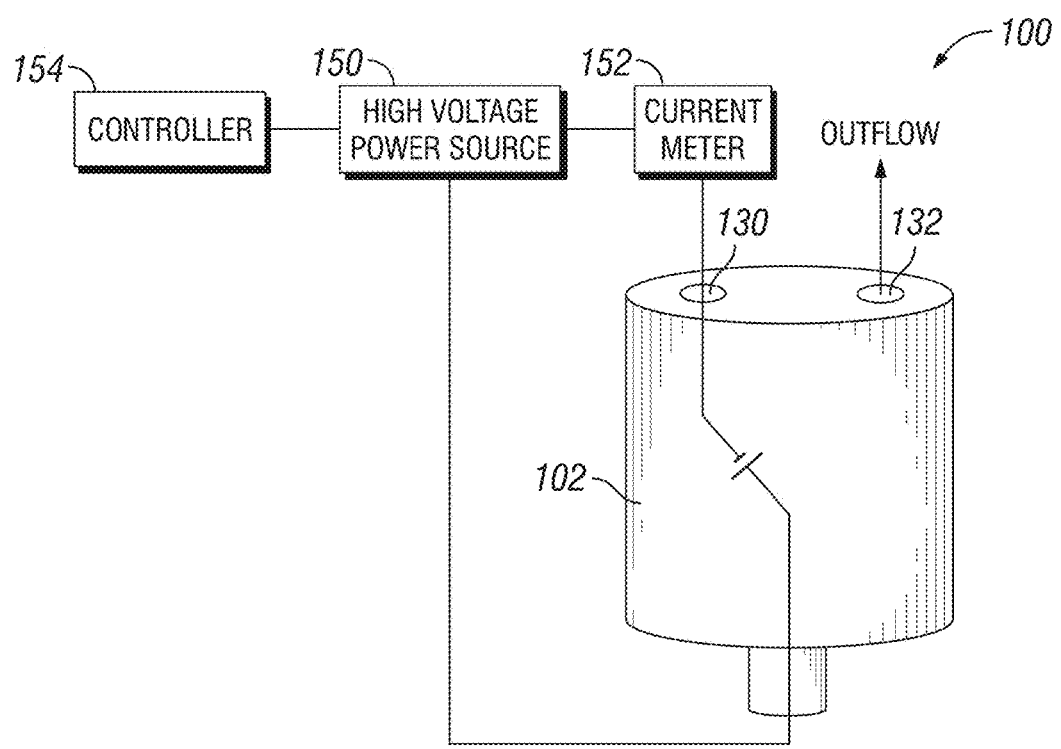
FIG. 5 is a block diagram showing reconditioning of a moving contact and a fixed contact of a vacuum interrupter, according to an embodiment of the present invention.

The second step is to then stand the vacuum interrupter 100 on its end, as shown in FIG. 5. Now, an amount of a second electropolishing solution is pumped into the hole 130, this time in an amount sufficient to fill the interior of the vacuum envelope 102 enough to submerse the contacts in the electropolishing solution. The second electropolishing solution is less harsh (or less acidic) than the first electropolishing solution, allowing for the electropolishing of the contacts without damage. The electropolishing process is then commenced, here with the contacts acting as the anode so as to electropolish the contacts, and then outflow is received through the hole 132, or in some embodiments through the first hole 130.

Instead of, or in addition to, the steps at Block 212 and Block 213 being performed, the reconditioning process may include the pumping of a dry gas, such as argon or nitrogen, or a mix thereof, into the interior of the vacuum interrupter 100 through the hole 130 (Block 214). In other cases, instead of, or in addition to, the steps at Block 212, Block 213, and Block 214 being performed, the vacuum interrupter 100 may simply be baked at a suitable temperature for a suitable period of time (Block 215).

Figure 6:
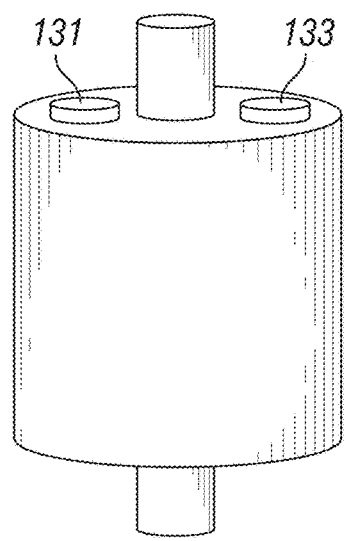
FIG. 6 is a perspective view showing a reconditioned vacuum interrupter.
Figure 7:
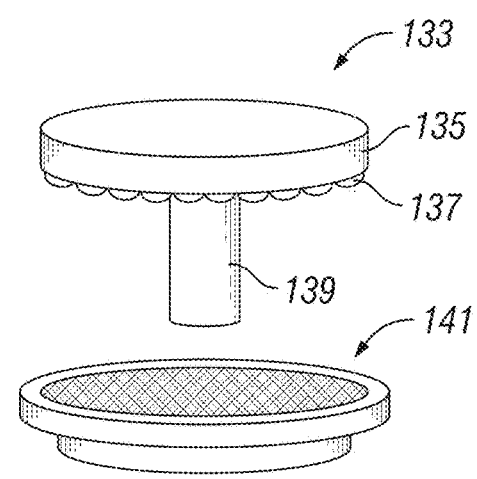
FIG. 7 is an exploded perspective view showing the getter plugs of FIG. 6.

Now that electropolishing or other reconditioning processes are complete, plugs are inserted into the holes (Block 216). This is depicted in FIG. 6, in which plugs 131 and 133 are installed into holes 130 and 132 to seal the holes. As shown in FIG. 7, the plugs (plug 133 is shown, although the structure of plug 131 is the same) include an upper plug portion 135 that seals against the end cap of the vacuum envelope, and a lower plug portion 139 that contains getter material that may be activatable via application of electrical power in some applications. A brazing filler ring 137 extends downwardly from the upper plug portion 135. The plug 133 is received by the insert 141, which itself makes contact with opening in the vacuum envelope 102 that defines the hole 132. In some embodiments, the plug 133 is installed directly into the opening in the vacuum envelope 102 that defines the hole 132. As will be understood by those of skill in the art, getter material absorbs gas, therefore helping to maintain the level of vacuum in the vacuum envelope 102 even in the presence of outgassing.

The vacuum plugs 131 and 133 are then vacuum brazed or soldered to the vacuum envelope 102 (at Block 218), thereby re-sealing the vacuum envelope 102, re-establishing vacuum inside of the vacuum envelope 102, and completing the reconditioning of the vacuum interrupter 100.

The vacuum brazing process will be recognized by those of skill in the art, and comprises the evacuation of gas from the vacuum interrupter so as to establish a vacuum and set the atmosphere inside the vacuum envelope 102 to desired specifications, and then the raising of the temperature of the environment in which the vacuum interrupter resides to a temperature sufficient to braze the brazing filler ring 137 but insufficient to affect the brazing between the vacuum envelope 102 and the end caps. Purging, temperature ramp-up, and cooling are subsequently performed as needed.

If desired, the vacuum interrupter may thereafter be repainted, and coatings may be added. These coatings may be anti-corrosive, depending upon the material forming the exterior surface of the vacuum envelop 102. If desired, prior to repainting and application of coatings, the exterior surface of the vacuum envelope may be polished.

The vacuum interrupter is then tested (Block 220), completing the method (Block 222). These tests can include measuring the resistance of the contacts over a range of operating temperature, the testing of the vacuum interrupter in a wipe assembly, the re-checking of remaining life expectancy of the contacts, the performance of a contact resistance test, the performance of a long term leak test (typically 5-10 minutes in duration), etc.

Another Alternative Method of Reconditioning a Vacuum Interrupter

After the start (Block 202), the method begins with determining whether the vacuum interrupter in question is actually suitable for reconditioning (Block 204). See FIG. 2B. Here, the vacuum interrupter may be removed from service and its installation, and it is determined whether the vacuum interrupter is in a good enough condition to permit for reconditioning, and whether, if the vacuum interrupter is in good enough condition, reconditioning is even desirable for that make and model of vacuum interrupter. If a vacuum interrupter has not out lived its wear limits or its contact structure has not seen too much damage, the vacuum interrupter will likely be suitable for reconditioning. Most vacuum interrupters have seen little operation or use. They need only to be reconditioned to go back into service. Expensive vacuum interrupters, or vacuum interrupter models for which immediate replacements are not available are particularly desirable candidates.

Regarding the condition of the vacuum interrupter itself, the vacuum interrupter will desirably be free of damage, will not have a leak, have contacts with at least 50% of their life remaining, and have that have a low resistance (and thus high conductance). Tests are performed in order to make these determinations.

For example, a visual inspection is used to check for corrosion and/or external damage. An external leak test or a magnetron test is performed to verify the absence of leaks. A contact erosion inspection/test is performed to verify that the contacts have at least 50% of their life remaining. This contact erosion inspection/test may be performed using x-ray imaging techniques. A contact resistance test performed with a digital low resistance ohmmeter is used to determine the resistance of the contact, and is passed if the resistance is below a given value.

If the vacuum interrupter is unsuitable for reconditioning (at Block 206), either because of its condition, or because it is a model where reconditioning is not economically advantageous, then the method ends (Block 207).

Figure 8:
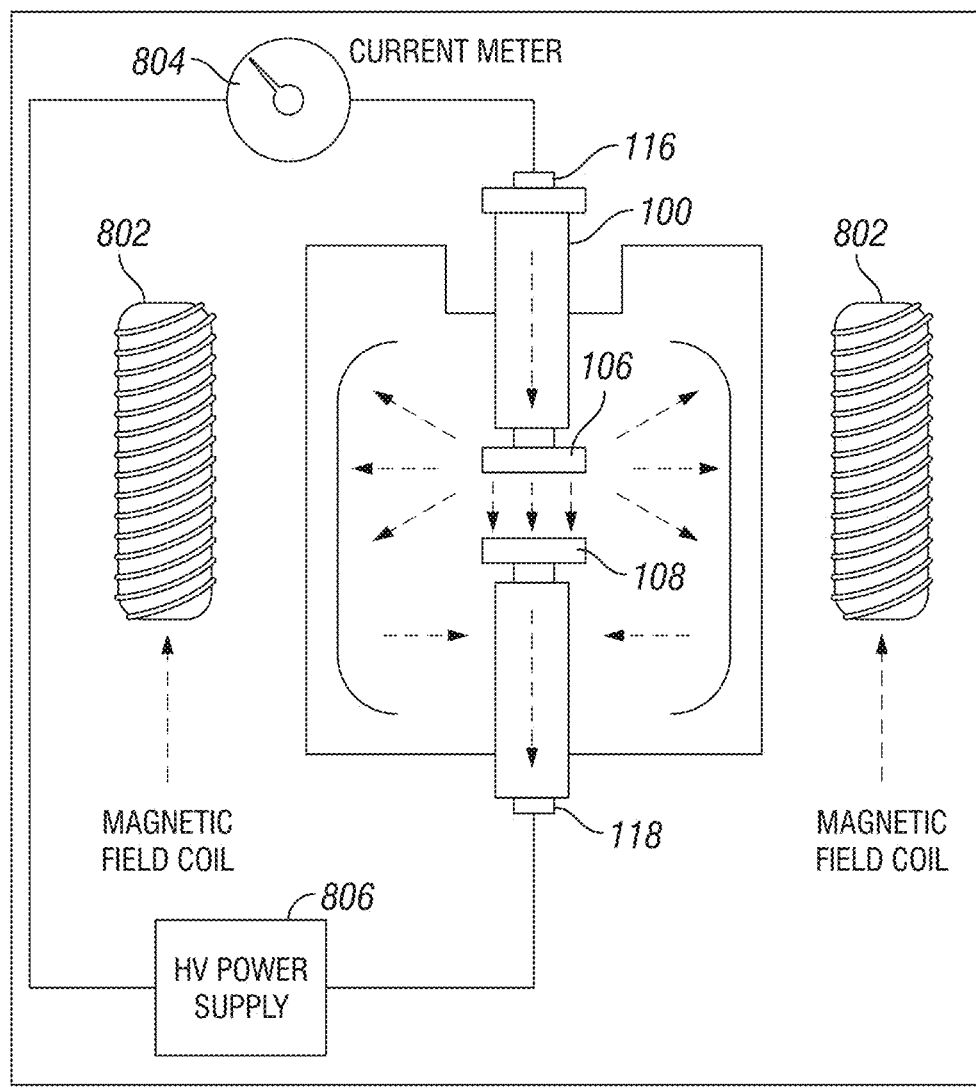
FIG. 8 is a schematic cross sectional view of a magnetic test setup, according to an embodiment of the present invention.

If the vacuum interrupter 100 is found to be suitable for reconditioning (at Block 206), then, optionally, a high voltage is applied across the vacuum interrupter 100 with its contacts open for a suitable period of time (at Block 208c). See FIGS. 2B & 8. The setup for this step is shown in FIG. 8. Here, it can be seen that a magnetic field coil 802 is disposed around the vacuum interrupter 100 with its contacts open (moving contact 108 moved away from the fixed contact 106 to break electrical contact therewith). A current meter 804 is electrically coupled to the first connector 116 of the vacuum interrupter 100. A high voltage supply 806 is electrically coupled to the current meter 804 and the second connector 118 of the vacuum interrupter 100.

The suitable period of time may be long term (typically 5-10 minutes in duration or longer) or it may be short term (less than 5 minutes). The voltage may be applied for a long term (typically 5-10 minutes in duration or longer) or a short term (less than 5 minutes) period of time. The voltage may be applied for about 30 minutes. The voltage may be applied for about 3 minutes.

The voltage may be applied repetitively for a long term (typically 10-20 pulses in duration or longer) or a short term (less than 5 pulses). The voltage may be applied for about 10 pulses.

The applied voltage depends on the size of the vacuum interrupter. The applied voltage may be from about 5 kVDC to about 100 kVDC, and any range or value there between. The applied voltage may be from about 50 kVDC to about 100 kVDC, and any range or value there between. For most vacuum interrupters, a suitable applied voltage is from about 5 kVDC to about 25 kVDC, and any range or value there between. The high voltage ionizes the gas molecules inside the vacuum interrupter.

A strong magnetic field is applied to the vacuum interrupter for a suitable period of time, causing the ions to move and to produce a current across the open contacts. See FIGS. 2B & 8. The suitable period of time may be long term (typically 5-10 minutes in duration or longer) or it may be short term (less than 5 minutes). The magnetic field may be applied long term (typically 5-10 minutes in duration or longer) or it may be short term (less than 5 minutes). The magnetic field may be applied for about 30 minutes. The magnetic field may be applied for about 3 minutes.

The magnetic field may be applied repetitively for a long term (typically 10-20 pulses in duration or longer) or a short term (less than 5 pulses). The magnetic field may be applied for about 10 pulses.

The applied magnetic field depends on the size of the vacuum interrupter. For most vacuum interrupters, a suitable applied magnetic field is from about 0.04 Tesla to about 0.2 Tesla, and any range or value there between. The ions are permanently entrapped by metal, getter and brazing materials inside the vacuum interrupter, reducing the pressure within the vacuum interrupter. At the end of the magnetic conditioning, the applied magnetic field and voltage are discontinued from the vacuum interrupter.

The vacuum interrupter is then tested (Block 220). These tests can include measuring the resistance of the contacts over a range of operating temperature, the testing of the vacuum interrupter in a wipe assembly, the re-checking of remaining life expectancy of the contacts, the performance of a contact resistance test, the performance of a long term leak test (typically 5-10 minutes in duration), etc.

If the vacuum interrupter is found to be suitable for further reconditioning (at Block 220), then, optionally, a high voltage is applied across the vacuum interrupter with its contacts open (Block 208a) for a suitable period of time. The setup for this step is shown in FIG. 8. Here, it can be seen that a magnetic field coil 802 is disposed around the vacuum interrupter 100 with its contacts open (moving contact 108 moved away from the fixed contact 106 to break electrical contact therewith). A current meter 804 is electrically coupled to the first connector 116 of the vacuum interrupter 100. A high voltage supply 806 is electrically coupled to the current meter 804 and the second connector 118 of the vacuum interrupter 100.

As discussed above, the suitable period of time may be long term (typically 5-10 minutes in duration or longer) or it may be short term (less than 5 minutes). The voltage may be applied long term (typically 5-10 minutes in duration or longer) or it may be short term (less than 5 minutes). The voltage may be applied for about 30 minutes. The voltage may be applied for about 3 minutes.

The voltage may be applied repetitively for a long term (typically 10-20 pulses in duration or longer) or a short term (less than 5 pulses). The voltage may be applied for about 10 pulses.

The applied voltage depends on the size of the vacuum interrupter. The applied voltage may be from about 5 kVDC to about 100 kVDC, and any range or value there between. The applied voltage may be from about 50 kVDC to about 100 kVDC, and any range or value there between. For most vacuum interrupters, a suitable applied voltage is from about 5 kVDC to about 25 kVDC, and any range or value there between. The high voltage ionizes gas molecules inside the vacuum interrupter.

A strong magnetic field is applied to the vacuum interrupter (Block 208a) for a suitable period of time, causing the ions to move and to produce a current across the open contacts. The suitable period of time may be long term (typically 5-10 minutes in duration or longer) or it may be short term (less than 5 minutes). The magnetic field may be applied long term (typically 5-10 minutes in duration or longer) or it may be short term (less than 5 minutes). The magnetic field may be applied for about 30 minutes. The magnetic field may be applied for about 3 minutes.

The magnetic field may be applied repetitively for a long term (typically 10-20 pulses in duration or longer) or a short term (less than 5 pulses). The magnetic field may be applied for about 10 pulses.

The applied magnetic field depends on the size of the vacuum interrupter. For most vacuum interrupters, a suitable applied magnetic field is from about 0.04 Tesla to about 0.2 Tesla, and any range or value there between. The ions are permanently entrapped by metal, getter and brazing materials inside the vacuum interrupter, reducing the pressure within the vacuum interrupter. At the end of the optional, long-term magnetic conditioning, the applied magnetic field and voltage are discontinued from the vacuum interrupter, completing the method (Block 222).

Alternative Method of Reconditioning a Vacuum Interrupter

After the start (Block 202), the method begins with determining whether the vacuum interrupter in question is actually suitable for reconditioning (Block 204). Here, the vacuum interrupter may be removed from service and its installation, and it is determined whether the vacuum interrupter is in a good enough condition to permit for reconditioning, and whether, if the vacuum interrupter is in good enough condition, reconditioning is even desirable for that make and model of vacuum interrupter. If a vacuum interrupter has not out lived its wear limits or its contact structure has not seen too much damage, the vacuum interrupter will likely be suitable for reconditioning. Most vacuum interrupters have seen little operation or use. They need only to be reconditioned to go back into service. Expensive vacuum interrupters, or vacuum interrupter models for which immediate replacements are not available are particularly desirable candidates.

Regarding the condition of the vacuum interrupter itself, the vacuum interrupter will desirably be free of damage, will not have a leak, have contacts with at least 50% of their life remaining, and have that have a low resistance (and thus high conductance). Tests are performed in order to make these determinations.

For example, a visual inspection is used to check for corrosion and/or external damage. An external leak test or a magnetron test is performed to verify the absence of leaks. A contact erosion inspection/test is performed to verify that the contacts have at least 50% of their life remaining. This contact erosion inspection/test may be performed using x-ray imaging techniques. A contact resistance test performed with a digital low resistance ohmmeter is used to determine the resistance of the contact, and is passed if the resistance is below a given value.

If the vacuum interrupter is unsuitable for reconditioning (at Block 206), either because of its condition, or because it is a model where reconditioning is not economically advantageous, then the method ends (Block 207).

If the vacuum interrupter is found to be suitable for reconditioning (at Block 206), then, optionally, a high voltage is applied across the vacuum interrupter with its contacts open (Block 208a) for a suitable period of time. The setup for this step is shown in FIG. 8. Here, it can be seen that a magnetic field coil 802 is disposed around the vacuum interrupter 100 with its contacts open (moving contact 108 moved away from the fixed contact 106 to break electrical contact therewith). A current meter 804 is electrically coupled to the first connector 116 of the vacuum interrupter 100. A high voltage supply 806 is electrically coupled to the current meter 804 and the second connector 118 of the vacuum interrupter 100.

The suitable period of time may be long term (typically 5-10 minutes in duration or longer) or it may be short term (less than 5 minutes). The voltage may be applied for a long term (typically 5-10 minutes in duration or longer) or a short term (less than 5 minutes) period of time. The voltage may be applied for about 30 minutes. The voltage may be applied for about 3 minutes.

The voltage may be applied repetitively for a long term (typically 10-20 pulses in duration or longer) or a short term (less than 5 pulses). The voltage may be applied for about 10 pulses.

The applied voltage depends on the size of the vacuum interrupter. The applied voltage may be from about 5 kVDC to about 100 kVDC, and any range or value there between. The applied voltage may be from about 50 kVDC to about 100 kVDC, and any range or value there between. For most vacuum interrupters, a suitable applied voltage is from about 5 kVDC to about 25 kVDC, and any range or value there between. The high voltage ionizes the gas molecules inside the vacuum interrupter.

A strong magnetic field is applied to the vacuum interrupter (Block 208a) for a suitable period of time, causing the ions to move and to produce a current across the open contacts. The suitable period of time may be long term (typically 5-10 minutes in duration or longer) or it may be short term (less than 5 minutes). The magnetic field may be applied for a long term (typically 5-10 minutes in duration or longer) or a short term (less than 5 minutes) period of time. The magnetic field may be applied for about 30 minutes. The magnetic field may be applied for about 3 minutes.

The magnetic field may be applied repetitively for a long term (typically 10-20 pulses in duration or longer) or a short term (less than 5 pulses). The magnetic field may be applied for about 10 pulses.

The applied magnetic field depends on the size of the vacuum interrupter. For most vacuum interrupters, a suitable applied magnetic field is from about 0.04 Tesla to about 0.2 Tesla, and any range or value there between. The ions are permanently entrapped by metal, getter and brazing materials inside the vacuum interrupter, reducing the pressure within the vacuum interrupter. At the end of the magnetic conditioning, the applied magnetic field and voltage are discontinued from the vacuum interrupter.

The exterior of the vacuum interrupter is cleaned (Block 208b). This cleaning can be performed by removing paint and external coatings on the vacuum interrupter, through the use of chemicals to clean the exterior surface of the vacuum interrupter, and then the washing of the vacuum interrupter.

After cleaning, if a pinched tube exists that travels through an endcap of the vacuum interrupter, such as may have been used during manufacture to generate the vacuum within the vacuum interrupter, the pinched tube and an associated stem guide can be removed, and the hole remaining can be used as a hole during the reconditioning process. Another hole may, in some embodiments, then be formed in either the endcap through which the pinched tube passed, or in the opposite endcap. If a pinched tube is not present, then two holes may be formed in either the same endcap, or with one each at opposing endcaps. The result of either alternative is that the vacuum interrupter now has a sum total of two holes in its endcaps (Block 210). It should be understood that in some embodiments only one hole in the endcaps may be necessary to accomplish the reconditioning process.

Therefore, in the present embodiment, the vacuum interrupter is now externally cleaned and has two holes in it, ready for reconditioning to begin (Block 211). The reconditioning process may begin with the pumping of a cleaning solution into the interior of the vacuum envelope of the vacuum interrupter through one hole, and the receipt of cleaning solution outflow from the other hole (Block 212). The cleaning solution used may be a chemical cleaning solution, such as methanol or acetone, may be an abrasive solution, or may be a combination of both.

The setup for this step is shown in FIG. 3. Here, it can be seen that a pump 144 is configured to pump the cleaning solution into the hole 130. Outflow is received from the hole 132. A particle counter 140 counts the solid particles in the outflow, and this count can be used to determine whether the cleaning process is complete. The outflow is run through a filter 142, which may have a removable and replaceable filtering element. This filter removes the solid particles from the output. The now cleaned outflow from the filter 142 is fed back to the pump 144, to be fed back into the hole 130. In some embodiments, only one hole is made in the endcaps and the cleaning solution is pumped into the hole and then removed from the same hole, after the cleaning solution step 212 has performed.

As depicted, the vacuum interrupter 100 is laid on its side during this process, although in some cases it may instead be stood on its end for this process.

After this cleaning step, an optional electropolishing is performed (Block 213) so as to recondition the interior surface of the vacuum envelope and the contact. This electropolishing is performed in two steps.

First, the vacuum interrupter 100 is set on its side, as shown in FIG. 4. Then, an amount of a first electropolishing solution is pumped into the hole 130. This amount is sufficient to permit electropolishing of the interior surface of the vacuum envelope 102 but insufficient to fill the vacuum envelope 102 to a level where the contacts within the vacuum envelope 102 touch the first electropolishing solution. This is done because the first electropolishing solution is harsh (or acidic) enough to damage the contacts, yet this level of harshness (or acidity) is used to accomplish the electropolishing of the interior surface of the vacuum envelope 102. Then, the electropolishing of the interior surface of the vacuum envelope 102 is performed while rotating the vacuum interrupter 100 so as to clean the entire interior surface of the vacuum envelope 102.

In electropolishing, as understood by those of skill in the art, the vacuum envelope 102 acts as an anode, and a cathode is inserted into the hole 130. The immersion in the electropolishing solution (which contains electrolytes), and the application of a voltage from a power supply 150 results in the electrical connection shown in FIG. 5. A current passes from the anode (the vacuum envelope 102) to the cathode, oxidizing and dissolving metal that may be on the interior surface of the vacuum envelope 102, helping to smooth the surface of the vacuum envelope 102. A current meter 152 measures this produced current so that the high voltage power source 150 (e.g., from about 50 kVDC to about 100 kVDC), under direction of the controller 154, maintains the produced current at a desired level (e.g., from about 5 µA to about 20 µA).

Once electropolishing of the interior surface of the vacuum envelope 102 is completed, outflow is received through the hole 132, or in some embodiments through the first hole 130.

The second step is to then stand the vacuum interrupter 100 on its end, as shown in FIG. 5. Now, an amount of a second electropolishing solution is pumped into the hole 130, this time in an amount sufficient to fill the interior of the vacuum envelope 102 enough to submerse the contacts in the electropolishing solution. The second electropolishing solution is less harsh (or less acidic) than the first electropolishing solution, allowing for the electropolishing of the contacts without damage. The electropolishing process is then commenced, here with the contacts acting as the anode so as to electropolish the contacts, and then outflow is received through the hole 132, or in some embodiments through the first hole 130.

Instead of, or in addition to, the steps at Block 212 and Block 213 being performed, the reconditioning process may include the pumping of a dry gas, such as argon or nitrogen, or a mix thereof, into the interior of the vacuum interrupter 100 through the hole 130 (Block 214). In other cases, instead of, or in addition to, the steps at Block 212, Block 213, and Block 214 being performed, the vacuum interrupter 100 may simply be baked at a suitable temperature for a suitable period of time (Block 215).

Now that electropolishing or other reconditioning processes are complete, plugs are inserted into the holes (Block 216). This is depicted in FIG. 6, in which plugs 131 and 133 are installed into holes 130 and 132 to seal the holes. As shown in FIG. 7, the plugs (plug 133 is shown, although the structure of plug 131 is the same) include an upper plug portion 135 that seals against the end cap of the vacuum envelope, and a lower plug portion 139 that contains getter material that may be activatable via application of electrical power in some applications. A brazing filler ring 137 extends downwardly from the upper plug portion 135. The plug 133 is received by the insert 141, which itself makes contact with opening in the vacuum envelope 102 that defines the hole 132. In some embodiments, the plug 133 is installed directly into the opening in the vacuum envelope 102 that defines the hole 132. As will be understood by those of skill in the art, getter material absorbs gas, therefore helping to maintain the level of vacuum in the vacuum envelope 102 even in the presence of outgassing.

The vacuum plugs 131 and 133 are then vacuum brazed or soldered to the vacuum envelope 102 (at Block 218), thereby re-sealing the vacuum envelope 102, re-establishing vacuum inside of the vacuum envelope 102, and completing the reconditioning of the vacuum interrupter 100.

The vacuum brazing process will be recognized by those of skill in the art, and comprises the evacuation of gas from the vacuum interrupter so as to establish a vacuum and set the atmosphere inside the vacuum envelope 102 to desired specifications, and then the raising of the temperature of the environment in which the vacuum interrupter resides to a temperature sufficient to braze the brazing filler ring 137 but insufficient to affect the brazing between the vacuum envelope 102 and the end caps. Purging, temperature ramp-up, and cooling are subsequently performed as needed.

If desired, the vacuum interrupter may thereafter be repainted, and coatings may be added. These coatings may be anti-corrosive, depending upon the material forming the exterior surface of the vacuum envelop 102. If desired, prior to repainting and application of coatings, the exterior surface of the vacuum envelope may be polished.

The vacuum interrupter is then tested (Block 220). These tests can include measuring the resistance of the contacts over a range of operating temperature, the testing of the vacuum interrupter in a wipe assembly, the re-checking of remaining life expectancy of the contacts, the performance of a contact resistance test, the performance of a long term leak test (typically 5-10 minutes in duration), etc.

If the vacuum interrupter is found to be suitable for further reconditioning (at Block 220), then, optionally, a high voltage is applied across the vacuum interrupter with its contacts open (Block 208*a*) for a suitable period of time. The setup for this step is shown in FIG. 8. Here, it can be seen that a magnetic field coil 802 is disposed around the vacuum interrupter 100 with its contacts open (moving contact 108 moved away from the fixed contact 106 to break electrical contact therewith). A current meter 804 is electrically coupled to the first connector 116 of the vacuum interrupter 100. A high voltage supply 806 is electrically coupled to the current meter 804 and the second connector 118 of the vacuum interrupter 100.

As discussed above, the suitable period of time may be long term (typically 5-10 minutes in duration or longer) or it may be short term (less than 5 minutes). The voltage may be applied for a long term (typically 5-10 minutes in duration or longer) or short term (less than 5 minutes) period of time. The voltage may be applied for about 30 minutes. The voltage may be applied for about 3 minutes.

The voltage may be applied repetitively for a long term (typically 10-20 pulses in duration or longer) or a short term (less than 5 pulses). The voltage may be applied for about 10 pulses.

The applied voltage depends on the size of the vacuum interrupter. The applied voltage may be from about 5 kVDC to about 100 kVDC, and any range or value there between. The applied voltage may be from about 50 kVDC to about 100 kVDC, and any range or value there between. For most vacuum interrupters, a suitable applied voltage is from about 5 kVDC to about 25 kVDC, and any range or value there between. The high voltage ionizes gas molecules inside the vacuum interrupter.

A strong magnetic field is applied to the vacuum interrupter (Block 208*a*) for a suitable period of time, causing the ions to move and to produce a current across the open contacts. The suitable period of time may be long term (typically 5-10 minutes in duration or longer) or it may be short term (less than 5 minutes). The magnetic field may be applied for a long term (typically 5-10 minutes in duration or longer) or a short term (less than 5 minutes). The magnetic field may be applied for about 3 minutes.

The magnetic field may be applied repetitively for a long term (typically 10-20 pulses in duration or longer) or a short term (less than 5 pulses). The magnetic field may be applied for about 30 minutes. The magnetic field may be applied for about 10 pulses.

The applied magnetic field depends on the size of the vacuum interrupter. For most vacuum interrupters, a suitable applied magnetic field is from about 0.04 Tesla to about 0.2 Tesla, and any range or value there between. The ions are permanently entrapped by metal, getter and brazing materials inside the vacuum interrupter, reducing the pressure within the vacuum interrupter. At the end of the optional, long-term magnetic conditioning, the applied magnetic field and voltage are discontinued from the vacuum interrupter, completing the method (Block 222).

EXAMPLE 1

A case study was completed on two high pressure vacuum interrupters that were more than twenty years old. The vacuum interrupters were suitable for reconditioning because they showed no signs of wear and no signs of unusual service corrosion or misapplication. Further, the breakers had less than 1000 open-close operations. The original test data showed that the vacuum interrupters had an ion current of about 2.4 E-04 A, indicating an internal pressure of about −2 Pa. The vacuum interrupters were stored for a year and retested to verify leakage rate was acceptable, and then subjected to a life pressure simulation protocol. The vacuum interrupters were tested a third time to ensure integrity was acceptable. The vacuum interrupters were subjected to reconditioning. A suitable voltage (e.g., from about 50 kVDC to about 100 kVDC) was applied to the vacuum interrupters depending on the size of the vacuum interrupter; and a suitable magnetic field (e.g., from about 0.04 Tesla to about 0.2 Tesla) was applied to the vacuum interrupters depending on the size of the vacuum interrupters. The magnetic field was applied for about 3 minutes per pulse; and the magnetic field was applied repetitively for 10 pulses. For both of the vacuum interrupters, the ion current was measured and recorded for each of the 10 pulses in a Table, as follows:

|  | Vacuum Interrupter Type | |
| --- | --- | --- |
|  | 50D1 | 50B1 |
|  | Serial No. | |
| Pulse No. | 26019 MAC Result A | 25102 MAC Result A |
| 1 | 6.850E−05 | 2.408E−04 |
| 2 | 1.161E−05 | 8.678E−05 |
| 3 | 2.721E−06 | 3.941E−05 |
| 4 | 1.019E−06 | 2.127E−05 |
| 5 | 5.441E−07 | 1.283E−05 |
| 6 | 3.777E−07 | 8.112E−06 |
| 7 | 2.839E−07 | 5.282E−06 |
| 8 | 1.562E−07 | 3.365E−06 |
| 9 | 1.902E−07 | 2.141E−06 |
| 10 | 1.915E−07 | 1.024E−07 |

Next, the vacuum interrupters were subjected to an accelerated life cycle gas testing to simulate being in services for five years, which showed no change in internal pressure. Subsequently, the vacuum interrupters were administered 100 normal, open-close operations under full-rated voltage at 15 kilojoules to simulate gas emissions from the metals during actual use.

Figure 9:
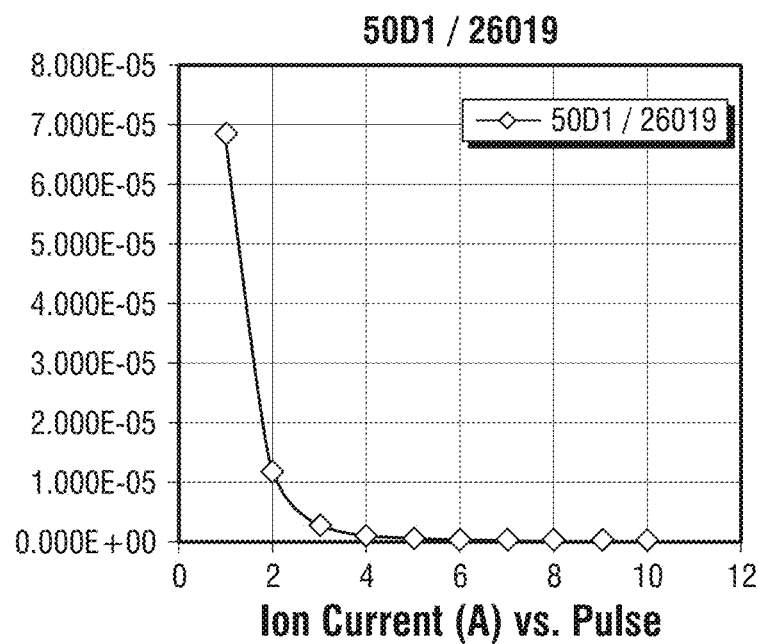
FIG. 9 is a chart of ion current (A) vs pulse for a vacuum interrupter Type 50D1, Serial No. 26019 showing ion current/internal pressure reductions with each pulse.
Figure 10:
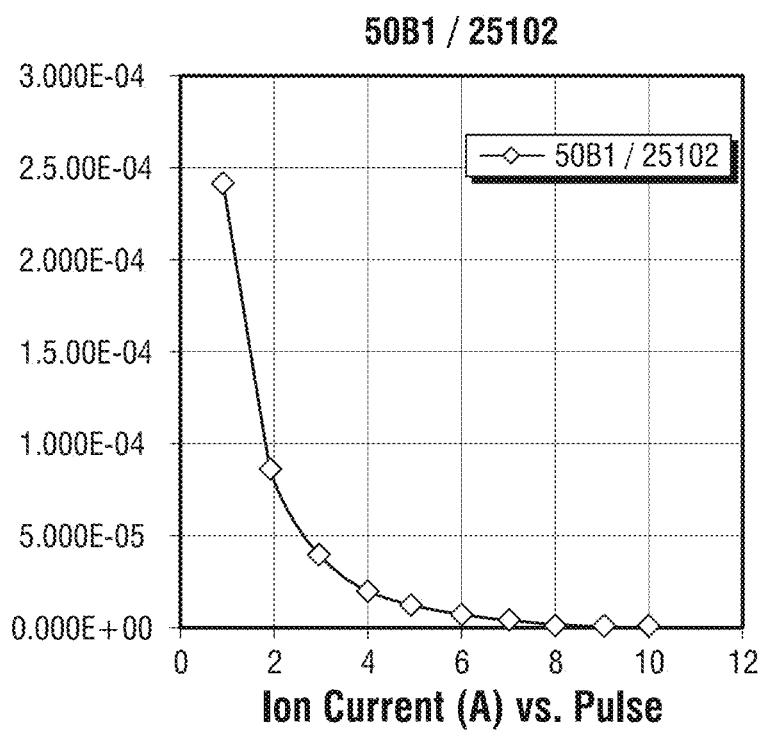
FIG. 10 is a chart of ion current (A) vs. pulse for a vacuum interrupter Type 50B1, Serial No. 25102 showing produced ion current/internal pressure reductions with each pulse.

FIG. 9 is a chart of ion current vs pulse for a vacuum interrupter Type 50D1, Serial No. 26019 showing ion current/internal pressure reduction with each pulse; and FIG. 10 is a chart of ion current vs. pulse for a vacuum interrupter Type 50B1, Serial No. 25102 showing ion current reductions with each pulse. These results are favorable.

EXAMPLE 2

Another case study was completed on three high pressure vacuum interrupters that were more than twenty years old. The vacuum interrupters had a very high ion current, indicating a high internal pressure. The three vacuum interrupters were tracked for ion current/internal pressure and were subjected to reconditioning on a regular basis over a period of nearly three years. A suitable voltage (e.g., from about 50 kVDC to about 100 kVDC) was applied to the vacuum interrupters depending on the size of the vacuum interrupter; and a suitable magnetic field (e.g., from about 0.04 Tesla to about 0.2 Tesla) was applied to the vacuum interrupters depending on the size of the vacuum interrupters. For the three vacuum interrupters, the ion current, produced current and resistance were measured and recorded for each test date in Table, as follows:

| | Vacuum Interrupter Type | | | | | | | | |
|---|---|---|---|---|---|---|---|---|---|
| | 44B1 | | | 44B1 | | | 44B1 | | |
| | Serial No. | | | | | | | | |
| | 56868 | | | 56665 | | | 56777 | | |
| Test Date | MAC Result A | Hipot Result µA @ 36 kVDC | Resistance µΩ | MAC Result A | Hipot Result µA @ 36 kVDC | Resistance µΩ | MAC Result A | Hipot Result µA @ 36 kVDC | Resistance µΩ |
| Jul. 31, 2015 | 5.143E−05 | 350 | 83 | 3.564E−04 | 390 | 83 | 2.032E−05 | 320 | 71 |
| Feb. 4, 2016 | 1.402E−05 | 500 | 15 | 3.337E−05 | 400 | 34 | 4.605E−05 | 360 | 15 |
| Aug. 17, 2016 | 1.400E−05 | 600 | 23 | 1.681E−04 | 420 | 17 | 2.130E−03 | 370 | 16 |
| Apr. 3, 2017 | 4.292E−06 | 680 | 19 | 6.239E−05 | 480 | 17 | 6.262E−04 | 380 | 17 |
| Oct. 3, 2017 | 3.964E−06 | 430 | 23 | 4.141E−05 | 480 | 14 | 4.726E−04 | 340 | 16 |
| May 1`, 2018 | 1.906E−06 | 1000 | 28 | 2.925E−05 | 740 | 14 | 2.657E−04 | 340 | 19 |

Figure 11:
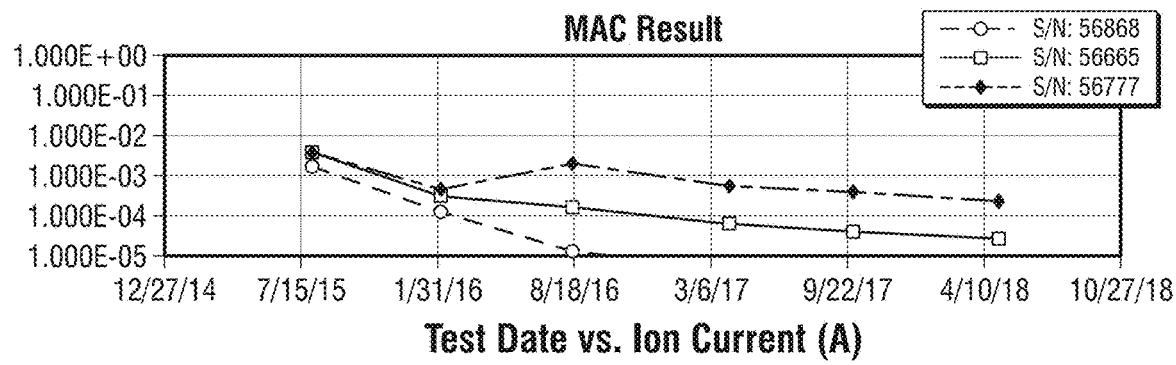
FIG. 11 is a chart of test date vs. ion current (A) for vacuum interrupter Type 44B1 Serial Nos. 56868, 56665 and 56777 showing ion current/internal pressure reductions with each test.
Figure 12:
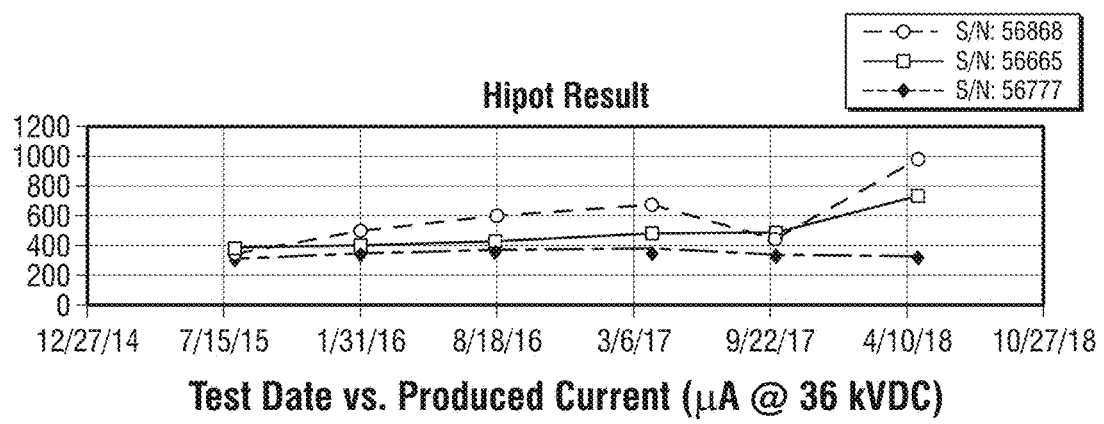
FIG. 12 is a chart of test date vs. produced current (μA@36 kVDC) for vacuum interrupter Type 44B1 Serial Nos. 56868, 56665 and 56777.
Figure 13:
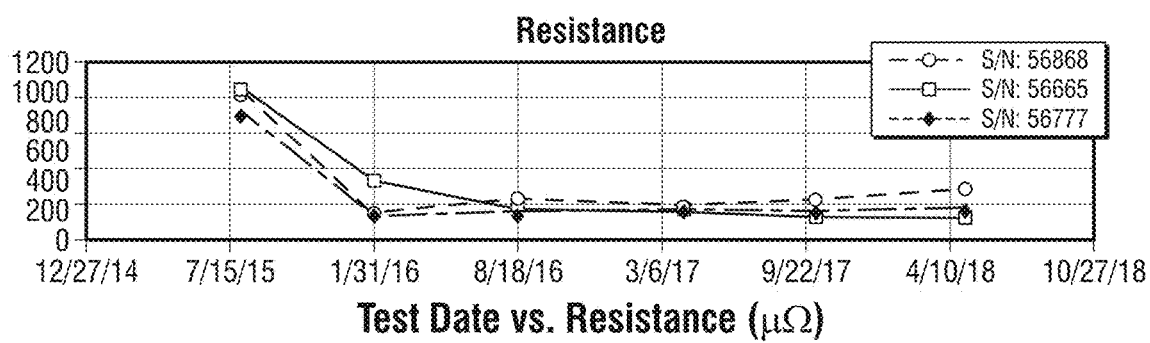
FIG. 13 is a chart of test date vs. resistance (μΩ) for vacuum interrupter Type 44B1 Serial Nos. 56868, 56665 and 56777.

FIG. 11 is a chart of test date vs. ion current (A) for vacuum interrupter Type 44B1 Serial Nos. 56868, 56665 and 56777 showing ion current/internal pressure reductions with each test date; FIG. 12 is a chart of test date vs. produced current (µA@36 kVDC) for vacuum interrupter Type 44B1 Serial Nos. 56868, 56665 and 56777; and FIG. 13 is a chart of test date vs. resistance (µΩ) for vacuum interrupter Type 44B1 Serial Nos. 56868, 56665 and 56777. These results are favorable.

Through the use of these methods, aging vacuum interrupters can be reconditioned, extending their service life, potentially to as long as 50-100 years or beyond. This can serve to reduce costs, as well as avoid long downtimes that can be created when a replacement vacuum interrupter is not readily available.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims. The invention is specifically intended to be as broad as the claims below and their equivalents.

DEFINITIONS

As used herein, the terms "a," "an," "the," and "said" means one or more, unless the context dictates otherwise.

As used herein, the term "about" means the stated value plus or minus a margin of error or plus or minus 10% if no method of measurement is indicated.

As used herein, the term "or" means "and/or" unless explicitly indicated to refer to alternatives only or if the alternatives are mutually exclusive.

As used herein, the terms "comprising," "comprises," and "comprise" are open-ended transition terms used to transition from a subject recited before the term to one or more elements recited after the term, where the element or elements listed after the transition term are not necessarily the only elements that make up the subject.

As used herein, the terms "containing," "contains," and "contain" have the same open-ended meaning as "comprising," "comprises," and "comprise," provided above.

As used herein, the terms "having," "has," and "have" have the same open-ended meaning as "comprising," "comprises," and "comprise," provided above.

As used herein, the terms "including," "includes," and "include" have the same open-ended meaning as "comprising," "comprises," and "comprise," provided above.

As used herein, the phrase "consisting of" is a closed transition term used to transition from a subject recited before the term to one or more material elements recited after the term, where the material element or elements listed after the transition term are the only material elements that make up the subject.

As used herein, the term "simultaneously" means occurring at the same time or about the same time, including concurrently.

INCORPORATION BY REFERENCE

All patents and patent applications, articles, reports, and other documents cited herein are fully incorporated by reference to the extent they are not inconsistent with this invention.

The invention claimed is:

1. A method of reconditioning a vacuum interrupter comprising:
   determining whether the vacuum interrupter is suitable for reconditioning;
   where the vacuum interrupter is suitable for reconditioning:
   forming at least one hole in an endcap of a vacuum envelope of the vacuum interrupter;
   cleaning components of the vacuum interrupter inside the vacuum envelope;
   removing a cleaning solution from a interior of the vacuum envelope;
   installing a plug in the at least one hole, wherein the plug has getter material on a surface thereof facing the interior of the vacuum envelope; and
   vacuum sealing the plug to the at least one hole such that a vacuum is re-established in the interior of the vacuum envelope.

2. The method of claim 1, wherein the components of the vacuum interrupter inside the vacuum envelope are cleaned by introducing at least one cleaning solution into the interior of the vacuum envelope through the at least one hole in the endcap.

3. The method of claim 2, wherein forming the at least one hole in the endcap comprises:
   forming first and second holes in the endcap; and
   wherein cleaning components of the vacuum interrupter inside the vacuum envelope comprises:

pumping a mechanical cleaning solution into the first hole in the endcap; and receiving outflow of the mechanical cleaning solution from the second hole in the endcap.

4. The method of claim 2, wherein forming the at least one hole in the endcap comprises:
forming first and second holes in the endcap; and
wherein cleaning components of the vacuum interrupter inside the vacuum envelope comprises:
pumping a chemical cleaning solution into the first hole in the endcap; and
receiving outflow of the chemical cleaning solution from the second hole in the endcap.

5. The method of claim 4, wherein cleaning components of the vacuum interrupter inside the vacuum envelope further comprises:
measuring a number of solid particles in the outflow of the chemical cleaning solution to determine when at least a first step of the cleaning is complete.

6. The method of claim 4, wherein cleaning components of the vacuum interrupter inside the vacuum envelope further comprises:
laying the vacuum interrupter on a side;
pumping an amount of a first electropolishing solution into the first hole in the end cap sufficient to permit electropolishing of an interior surface of the vacuum envelope but insufficient to fill the vacuum envelope to a level where a fixed contact and a moving contact within the vacuum envelope touch the first electropolishing solution;
electropolishing the interior surface of the vacuum envelope;
receiving outflow of the first electropolishing solution from the second hole in the endcap;
standing the vacuum interrupter up on an end thereof;
pumping an amount of a second electropolishing solution into the first hole in the end cap sufficient to fill the vacuum envelope to a level where the fixed contact and the moving contact are immersed in the electropolishing solution; and
electropolishing the fixed contact and the moving contact;
wherein the first electropolishing solution would damage the fixed contact and the moving contact but the second electropolishing does not damage the interior surface of the vacuum envelope.

7. The method of claim 1, wherein determining whether the vacuum interrupter is suitable for reconditioning comprises:
determining whether components within the vacuum envelope of the vacuum interrupter are damaged;
determining whether the vacuum envelope has a leak; and
estimating a remaining life of a fixed contact and a moving contact within the vacuum envelope.

8. The method of claim 7, wherein determining whether components within the vacuum envelope of the vacuum interrupter are damaged comprises:
performing a resistance test on the fixed contact and the moving contact.

9. The method of claim 7, wherein estimating the remaining life of the fixed contact and the moving contact comprises:
performing a contact erosion test.

10. The method of claim 1, wherein forming the at least one hole in the endcap comprises:
removing a tube having a sealed end and passing through the endcap so as to expose a first hole through which the tube passed; and
punch forming a second hole in the endcap.

11. The method of claim 1, wherein forming the at least one hole in the endcap comprises:
forming a first hole in the endcap; and
forming a second hole in the endcap.

12. The method of claim 1, when the vacuum interrupter is suitable for reconditioning, the method further comprises:
testing the vacuum interrupter to verify a presence of the vacuum and an absence of leaks, after the vacuum sealing of the plug to the at least one hole.

13. The method of claim 1, when the vacuum interrupter is suitable for reconditioning, the method further comprises:
removing external coatings from the vacuum interrupter prior to forming the at least one hole in the endcap.

14. The method of claim 1, wherein cleaning components of the vacuum interrupter inside the vacuum envelope comprises:
pumping argon gas and/or nitrogen gas inside the vacuum envelope.

15. The method of claim 1, wherein cleaning components of the vacuum interrupter inside the vacuum envelope comprises:
baking the vacuum interrupter.

16. The method of claim 1, where the vacuum interrupter is suitable for reconditioning, the method further comprises:
polishing an exterior surface of the vacuum envelope.

17. A method of reconditioning a vacuum interrupter comprising:
forming first and second holes in an endcap of a vacuum envelope of the vacuum interrupter;
cleaning components of the vacuum interrupter inside the vacuum envelope by introducing at least one cleaning solution into an interior of the vacuum envelope through the first hole in the endcap and receiving outflow of the at least one cleaning solution through the second hole in the endcap;
electropolishing an interior surface of the vacuum envelope in such fashion so as to not damage a fixed contact and a moving contact carried within the vacuum envelope, using a first electropolishing solution;
electropolishing the fixed contact and the moving contact, using a second electropolishing solution different than the first electropolishing solution;
installing a first plug in the first hole and a second plug in the second hole, wherein the first plug has getter material on a surface thereof facing the interior of the vacuum envelope and wherein the second plug has getter material on a surface thereof facing the interior of the vacuum envelope; and
vacuum brazing the first plug to the first hole and vacuum braze the second plug to the second hole such that a vacuum is re-established in the interior of the vacuum envelope.

18. The method of claim 17, wherein forming the first hole in the endcap comprises:
removing a tube having a sealed end and passing through the endcap so as to expose the first hole through which the tube passed.

19. The method of claim 17, wherein cleaning the components of the vacuum interrupter inside the vacuum envelope further comprises:
measuring a number of solid particles in the outflow of a chemical cleaning solution to determine when the cleaning is complete.

20. The method of claim 17, wherein electropolishing the interior surface of the vacuum envelope in such fashion so as to not damage the fixed contact and the moving contact comprises:

laying the vacuum interrupter on a side;
pumping an amount of the first electropolishing solution into the first hole in the end cap sufficient to permit electropolishing of the interior surface of the vacuum envelope but insufficient to fill the vacuum envelope to a level where a fixed contact and a moving contact within the vacuum envelope touch the first electropolishing solution;
electropolishing the interior surface of the vacuum envelope; and
receiving outflow of the first electropolishing solution from the second hole in the endcap.

21. The method of claim 20, wherein electropolishing the interior surface of the vacuum envelope in such fashion so as to not damage the fixed contact and the moving contact further comprises:
rotating the vacuum envelope while electropolishing the interior surface thereof.

22. The method of claim 20, wherein electropolishing the fixed contact and the moving contact comprises:
standing the vacuum interrupter up on an end thereof;
pumping an amount of the second electropolishing solution into the first hole in the end cap sufficient to fill the vacuum envelope to a level where the fixed contact and the moving contact are immersed in the electropolishing solution; and
electropolishing the fixed contact and the moving contact.

23. A method of reconditioning a vacuum interrupter comprising:
determining whether the vacuum interrupter is suitable for reconditioning;
where the vacuum interrupter is suitable for reconditioning:
applying a magnetic field to the vacuum interrupter with a moving contact of the vacuum interrupter moved away from a fixed contact of the vacuum interrupter to break electrical contact; and
applying a voltage to the vacuum interrupter to reduce pressure inside the vacuum interrupter.

24. The method of claim 23, wherein the applying the voltage to the vacuum interrupter comprises:
electrically coupling a current meter to a first conductor of the vacuum interrupter; and
electrically coupling a high voltage power supply to a second conductor of the vacuum conductor to reduce pressure inside the vacuum interrupter.

25. The method of claim 23, wherein the magnetic field and/or the voltage are applied for a short term period of time.

26. The method of claim 23, wherein the magnetic field and/or the voltage are applied for a long term period of time.

27. The method of claim 23, wherein the magnetic field is from about 0.04 Tesla to about 0.2 Tesla and the voltage is from about 5 kVDC to about 100 kVDC.

28. The method of claim 23, wherein, when the vacuum interrupter is suitable for reconditioning, the method further comprises:
testing the vacuum interrupter to verify a presence of a vacuum and an absence of leaks, after a vacuum sealing of a plug to the at least one hole.

29. The method of claim 23, when the vacuum interrupter is suitable for reconditioning, the method further comprises:
forming at least one hole in an endcap of a vacuum envelope of the vacuum interrupter;
cleaning components of the vacuum interrupter inside the vacuum envelope; removing a cleaning solution from an interior of the vacuum envelope; installing a plug in the at least one hole, wherein the plug has getter material on a surface thereof facing the interior of the vacuum envelope; and
vacuum sealing the plug to the at least one hole such that a vacuum is re-established in the interior of the vacuum envelope.

30. The method of claim 29, wherein the components of the vacuum interrupter inside the vacuum envelope are cleaned by introducing at least one cleaning solution into the interior of the vacuum envelope through the at least one hole in the endcap.

31. The method of claim 30, wherein forming the at least one hole in the endcap comprises:
forming first and second holes in the endcap; and
wherein cleaning components of the vacuum interrupter inside the vacuum envelope comprises:
pumping a mechanical cleaning solution into the first hole in the endcap; and receiving outflow of the mechanical cleaning solution from the second hole in the endcap.

32. The method of claim 30, wherein forming the at least one hole in the endcap comprises:
forming first and second holes in the endcap; and
wherein cleaning components of the vacuum interrupter inside the vacuum envelope comprises:
pumping a chemical cleaning solution into the first hole in the endcap; and
receiving outflow of the chemical cleaning solution from the second hole in the endcap.

33. The method of claim 32, wherein cleaning components of the vacuum interrupter inside the vacuum envelope further comprises:
measuring a number of solid particles in the outflow of the chemical cleaning solution to determine when at least a first step of the cleaning is complete.

34. The method of claim 32, wherein cleaning components of the vacuum interrupter inside the vacuum envelope further comprises:
laying the vacuum interrupter on a side;
pumping an amount of a first electropolishing solution into the first hole in the end cap sufficient to permit electropolishing of an interior surface of the vacuum envelope but insufficient to fill the vacuum envelope to a level where the fixed contact and the moving contact within the vacuum envelope touch the first electropolishing solution;
electropolishing the interior surface of the vacuum envelope;
receiving outflow of the first electropolishing solution from the second hole in the endcap;
standing the vacuum interrupter up on an end thereof;
pumping an amount of a second electropolishing solution into the first hole in the end cap sufficient to fill the vacuum envelope to a level where the fixed contact and the moving contact are immersed in the electropolishing solution; and
electropolishing the fixed contact and the moving contact;
wherein the first electropolishing solution would damage the fixed contact and the moving contact but the second electropolishing does not damage the interior surface of the vacuum envelope.

35. The method of claim 29, wherein determining whether the vacuum interrupter is suitable for reconditioning comprises:
determining whether components within the vacuum envelope of the vacuum interrupter are damaged;
determining whether the vacuum envelope has a leak; and estimating a remaining life the fixed contact and the moving contact within the vacuum envelope.

36. The method of claim 35, wherein determining whether components within the vacuum envelope of the vacuum interrupter are damaged comprises:
performing a resistance test on the fixed contact and the moving contact.

37. The method of claim 35, wherein estimating the remaining life of the fixed contact and the moving contact comprises:
performing a contact erosion test.

38. The method of claim 29, wherein forming the at least one hole in the endcap comprises:
removing a tube having a sealed end and passing through the endcap so as to expose a first hole through which the tube passed; and
punchforming a second hole in the endcap.

39. The method of claim 29, wherein forming the at least one hole in the endcap comprises:
forming a first hole in the endcap; and
forming a second hole in the endcap.

40. The method of claim 29, when the vacuum interrupter is suitable for reconditioning, the method further comprises:
testing the vacuum interrupter to verify a presence of the vacuum and an absence of leaks, after the vacuum sealing of the plug to the at least one hole.

41. The method of claim 29, when the vacuum interrupter is suitable for reconditioning, the method further comprises:
removing external coatings from the vacuum interrupter prior to forming the at least one hole in the endcap.

42. The method of claim 29, wherein cleaning components of the vacuum interrupter inside the vacuum envelope comprises:
pumping argon gas and/or nitrogen gas inside the vacuum envelope.

43. The method of claim 29, wherein cleaning components of the vacuum interrupter inside the vacuum envelope comprises:
baking the vacuum interrupter.

44. The method of claim 29, where the vacuum interrupter is suitable for reconditioning, the method further comprises:
polishing an exterior surface of the vacuum envelope.

45. The method of claim 29, wherein the applying the voltage to the vacuum interrupter comprises:
electrically coupling a current meter to a first conductor of the vacuum interrupter; and
electrically coupling a high voltage power supply to a second conductor of the vacuum interrupter to reduce pressure inside the vacuum interrupter.

46. The method of claim 29, wherein the magnetic field and/or the voltage are applied for a long term period of time.

47. The method of claim 29, wherein the magnetic field is from about 0.04 Tesla to about 0.2 Tesla and the voltage is from about 5 kVDC to about 100 kVDC.

48. The method of claim 23 further comprising:
forming first and second holes in an endcap of a vacuum envelope of the vacuum interrupter;
cleaning components of the vacuum interrupter inside the vacuum envelope by introducing at least one cleaning solution into an interior of the vacuum envelope through the first hole in the endcap and receiving outflow of the at least one cleaning solution through the second hole in the endcap;
electropolishing an interior surface of the vacuum envelope in such fashion so as to not damage the fixed contact and the moving contact carried within the vacuum envelope, using a first electropolishing solution;
electropolishing the fixed contact and the moving contact, using a second electropolishing solution different than the first electropolishing solution;
installing a first plug in the first hole and a second plug in the second hole, wherein the first plug has getter material on a surface thereof facing the interior of the vacuum envelope and wherein the second plug has getter material on a surface thereof facing the interior of the vacuum envelope; and
vacuum brazing the first plug to the first hole and vacuum braze the second plug to the second hole such that a vacuum is re-established in the interior of the vacuum envelope.

49. The method of claim 48, wherein forming the first hole in the endcap comprises:
removing a tube having a sealed end and passing through a hole in the endcap so as to expose the hole through which the tube passed.

50. The method of claim 48, wherein cleaning the components of the vacuum interrupter inside the vacuum envelope further comprises:
measuring a number of solid particles in an outflow of a chemical cleaning solution to determine when a cleaning is complete.

51. The method of claim 48, wherein electropolishing the interior surface of the vacuum envelope in such fashion so as to not damage the fixed contact and the moving contact comprises:
laying the vacuum interrupter on a side;
pumping an amount of the first electropolishing solution into the first hole in the end cap sufficient to permit electropolishing of the interior surface of the vacuum envelope but insufficient to fill the vacuum envelope to a level where the fixed contact and the moving contact within the vacuum envelope touch the first electropolishing solution;
electropolishing the interior surface of the vacuum envelope; and
receiving outflow of the first electropolishing solution from the second hole in the endcap.

52. The method of claim 51, wherein electropolishing the interior surface of the vacuum envelope in such fashion so as to not damage the fixed contact and the moving contact further comprises:
rotating the vacuum envelope while electropolishing the interior surface thereof.

53. The method of claim 51, wherein electropolishing the fixed contact and the moving contact comprises:
standing the vacuum interrupter up on an end thereof;
pumping an amount of the second electropolishing solution into the first hole in the end cap sufficient to fill the vacuum envelope to a level where the fixed contact and the moving contact are immersed in the electropolishing solution; and
electropolishing the fixed contact and the moving contact.

54. The method of claim 48, wherein the applying the voltage to the vacuum interrupter comprises:
electrically coupling a current meter to a first conductor of the vacuum interrupter; and
electrically coupling a high voltage power supply to a second conductor of the vacuum conductor to reduce pressure inside the vacuum interrupter.

55. The method of claim 48, wherein the magnetic field and/or the voltage are applied for a long term period of time.

56. The method of claim 48, wherein the magnetic field is from about 0.04 Tesla to about 0.2 Tesla and the voltage is from about 5 kVDC to about 100 kVDC.

* * * * *